US006957318B2

(12) United States Patent
Emberson et al.

(10) Patent No.: US 6,957,318 B2
(45) Date of Patent: Oct. 18, 2005

(54) METHOD AND APPARATUS FOR CONTROLLING A MASSIVELY PARALLEL PROCESSING ENVIRONMENT

(75) Inventors: David R. Emberson, Santa Cruz, CA (US); Jeffrey M. Broughton, Pleasanton, CA (US); James B. Burr, Foster City, CA (US); Derek E. Pappas, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 574 days.

(21) Appl. No.: 10/112,118

(22) Filed: Mar. 28, 2002

(65) Prior Publication Data

US 2003/0037222 A1 Feb. 20, 2003

Related U.S. Application Data

(60) Provisional application No. 60/313,217, filed on Aug. 17, 2001.

(51) Int. Cl.[7] .............................................. G06F 3/00
(52) U.S. Cl. .......................................... 712/11; 712/15
(58) Field of Search ........................ 712/11, 15; 703/25

(56) References Cited

U.S. PATENT DOCUMENTS 4,860,201 A * 8/1989 Stolfo et al. ................... 712/11
5,020,059 A * 5/1991 Gorin et al. .................... 714/3
5,394,556 A * 2/1995 Oprescu ...................... 709/220
5,634,113 A * 5/1997 Rusterholz ................... 716/13
5,784,632 A * 7/1998 Pechanek et al. ............. 712/11
6,000,024 A * 12/1999 Maddox ...................... 712/11
6,108,698 A * 8/2000 Tenev et al. ................. 709/220
6,154,463 A * 11/2000 Aggarwal et al. .......... 370/408
6,760,744 B1 * 7/2004 Halaas et al. ............... 709/201

* cited by examiner

Primary Examiner—Eric Coleman
(74) Attorney, Agent, or Firm—Osha Liang LLP

(57) ABSTRACT

A method for controlling a processor array by a host computer involves creating a graph of a plurality of nodes using a data connection component, configuring a broadcast tree from a spanning tree of the graph, propagating a first command from the host computer to a member of the processor array using the broadcast tree, configuring a reply tree from a spanning tree of the graph, transmitting a response from the member of the processor array to the host computer using the reply tree, and configuring the data connection component to send at least one message selected from the first command and the response on at least one run mode communication path.

26 Claims, 12 Drawing Sheets

METHOD AND APPARATUS FOR CONTROLLING A MASSIVELY PARALLEL PROCESSING ENVIRONMENT

This application claims benefit to Provisional Application Ser. No. 60/313,217, filed Aug. 17, 2001, entitled "Phaser System Architecture," and invented by Thomas M. McWilliams; Jeffrey B. Rubin; Derek Pappas; Kunle Olukotun; Jeffrey Broughton; David R. Emberson; William Lam; Liang T. Chen; Ihao Chen; Earl T. Cohen; and Michael Parkin.

BACKGROUND OF THE INVENTION

Cycle-based logic simulation is applicable to synchronous digital systems and may be utilized to verify the functional correctness of a digital design. Cycle-based simulators use algorithms that eliminate unnecessary calculations to achieve improved performance in verifying system functionality. Typically, in a cycle-based logic simulator the entire system is evaluated once at the end of each clock cycle. Discrete component evaluations and re-evaluations are typically unnecessary upon the occurrence of every event.

HDL simulations may be event driven or cycle-based. Event driven simulations propagate a change in state from one set of circuit elements to another. Event driven simulators may record relative timing information of the change in state so that timing and functional correctness may be verified. Cycle-based HDL simulations also simulate a change in state from one set of circuit elements to another. Cycle-based HDL simulations, however, evaluate the state of the system once at the end of each clock cycle. While specific intra-cycle timing information is not available, simulation speed is improved.

HDL simulations may be executed on reconfigurable hardware, such as a field programmable gate array (FPGA) chip. The FPGA allows dedicated hardware to be configured to match the HDL code. FPGA hardware provides a method to improve the simulation time. As the design changes, the time required to reconfigure the FPGA arrangement may prohibit many iterations. Also, the number of FPGA chips required for complex designs may be relatively large.

HDL simulations may also be executed on general purpose processors. General purpose processors, including parallel general purpose processors, are not designed specifically for HDL simulations. HDL simulations require a large number of operations of inputs and outputs that use bit-wise operations.

Large logic simulations are frequently executed on parallel or massively parallel computing systems. For example, parallel computing systems may be specifically designed massively parallel processing (MPP) systems or equally a collection, or "farm," of connected general purpose processing systems. FIG. 1 shows a block diagram of a typical parallel computing system (100) used to simulate a HDL logic design. Multiple processor arrays (112a, 112b, 112n) are available to simulate the HDL logic design. A host computer (116), with associated data store (117), controls a simulation of the logic design that executes on one or more of the processor arrays (112a, 112b, 112n) through an interconnect switch (118). The processor arrays (112a, 112b, 112n) may be a collection of processing elements or multiple general purpose processors. The interconnect switch (118) may be a specifically designed interconnect or a general purpose communication system, for example, an Ethernet network.

A general purpose computer (120) with a human interface (122), such as a GUI or a command line interface, together with the host computer (116) support common functions of a simulation environment. These functions may include, but are not limited to, an interactive display, modification of the simulation state, setting of execution breakpoints based on simulation times and states, use of test vectors files and trace files, use of HDL modules that execute on the host computer and are called from the processor arrays, check pointing and restoration of running simulations, the generation of value change dump files compatible with waveform analysis tools, and single execution of a clock cycle.

While simulating a hardware design in an MPP environment, at least two goals exist. First, the multiple processors should be effectively controlled. Second, the multiple processors should run effectively. One way to control an MPP system, for instance, is to use the host computer, or another similar mechanism, to exert control on the MPP system by essentially telling the processors what to do and when to run. This can be accomplished, for instance, by sending packets of information to the processors, which they act upon.

In contrast to controlling a MPP system, running a MPP system involves connecting the processors in such a way that they can communicate with one another and pass data and instructions between each other so that at all times, the majority of the processors can be active simultaneously. For instance, a processor may often wait for the result of a computation performed by another processor in order to use the result to perform its own computation. To accomplish this task while running, a correct path for the data is required.

Typically processors interconnect and pass data between one another using pins. Pins are designed to carry an electrical charge and are able to connect to the pins of other processors. The number of pins that each processor has, however, is limited and to both control and run an MPP system involves two distinct types of communication. Thus, in typical MPP systems, the amount of pins required to perform both tasks quickly exceeds the number of pins available on the processor. Therefore, conservation of the amount of pins required to control and run an MPP system is desirable.

SUMMARY OF INVENTION

In general, in one aspect, the present invention involves a method for controlling a processor array by a host computer. The method comprises creating a graph of a plurality of nodes using a data connection component, configuring a broadcast tree from a spanning tree of the graph, propagating a first command from the host computer to a member of the processor array using the broadcast tree, configuring a reply tree from a spanning tree of the graph, transmitting a response from the member of the processor array to the host computer using the reply tree, and configuring the data connection component to send at least one message selected from the first command and the response on at least one run mode communication path.

In general, in one aspect, the present invention involves a method for controlling a processor array by a host computer. The method comprises creating a graph of a plurality of nodes using a data connection component, configuring a broadcast tree from a spanning tree of the graph, propagating a first command from the host computer to a member of the processor array using the broadcast tree; configuring a reply tree from a spanning tree of the graph, transmitting a response from the member of the processor array to the host computer using the reply tree, configuring the data connection component to send at least one message selected from the first command and the response on at least one run mode communication path, configuring the broadcast tree to send the first command from the host computer to every node of the broadcast tree, configuring the broadcast tree to send the first command from the host computer to a particular node of the broadcast tree, and configuring the reply tree to send the response to the host computer from every node of the reply tree.

In general, in one aspect, the present invention involves a network system. The network system comprises a plurality of nodes, a plurality of communication paths between the plurality of nodes, a broadcast tree comprised of the plurality of nodes interconnected by the plurality of communication paths, and a reply tree comprised of the plurality of nodes interconnected by the plurality of communication paths. A member of the plurality of nodes comprises at least one execution processor. The broadcast tree and the reply tree are operatively connected to a host computer.

In general, in one aspect, the present invention involves a host computer system for controlling a processor array. The host computer system comprises a processor, a memory, a storage device, and software instructions stored in the memory for enabling the host computer system under the control of the processor, to perform creating a graph of a plurality of nodes using a data connection component, configuring a broadcast tree from a spanning tree of the graph, propagating a first command from the host computer to a member of the processor array using the broadcast tree, configuring a reply tree from a spanning tree of the graph, transmitting a response from the member of the processor array to the host computer using the reply tree, and configuring the data connection component to send at least one message selected from the first command and the response on at least one run mode communication path.

In general, in one aspect, the present invention involves an apparatus for controlling a processor array by a host computer. The apparatus comprises means for creating a graph of a plurality of nodes using a data connection component, means for configuring a broadcast tree from a spanning tree of the graph, means for propagating a first command from the host computer to a member of the processor array using the broadcast tree, means for configuring a reply tree from a spanning tree of the graph, means for transmitting a response from the member of the processor array to the host computer using the reply tree, and means for configuring the data connection component to send at least one message selected from the first command and the response on at least one run mode communication path.

Other aspects and advantages of the invention will be apparent from the following description and the appended claims.

DETAILED DESCRIPTION

Figure 1:
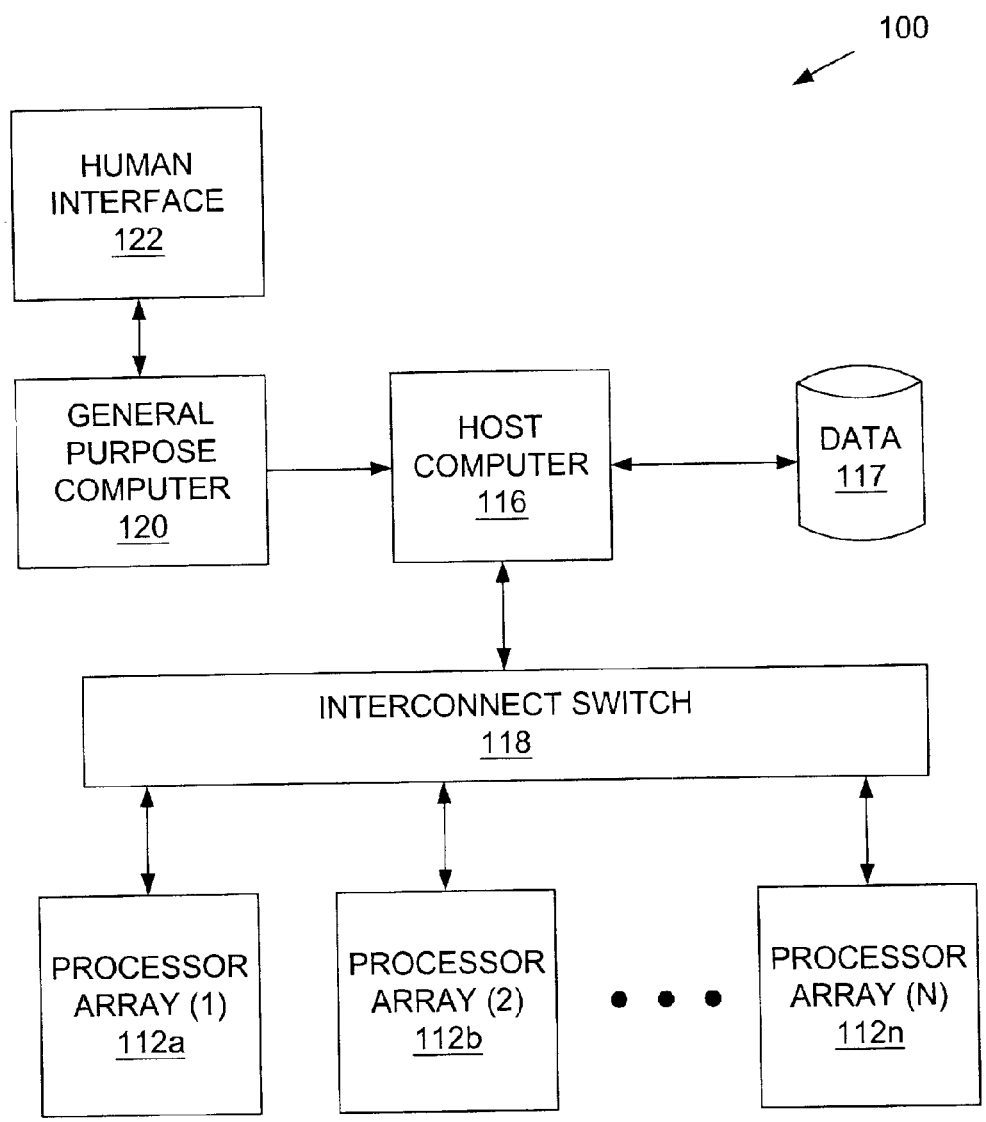
FIG. 1 shows a typical parallel computer system.

Specific embodiments of the invention will now be described in detail with reference to the accompanying figures. Like elements in the various figures are denoted by like reference numerals for consistency.

The present invention is a method and apparatus for controlling a massively parallel processing environment. In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In an embodiment of the present invention, the computer execution environment may use execution processors to execute execution processor code on a general purpose computer, such as a SPARC™ workstation produced by Sun Microsystems, Inc., or specialized hardware for performing cycle-based computations, e.g. a Phaser system.

The specialized hardware for performing cycle-based computations is a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Figure 2:
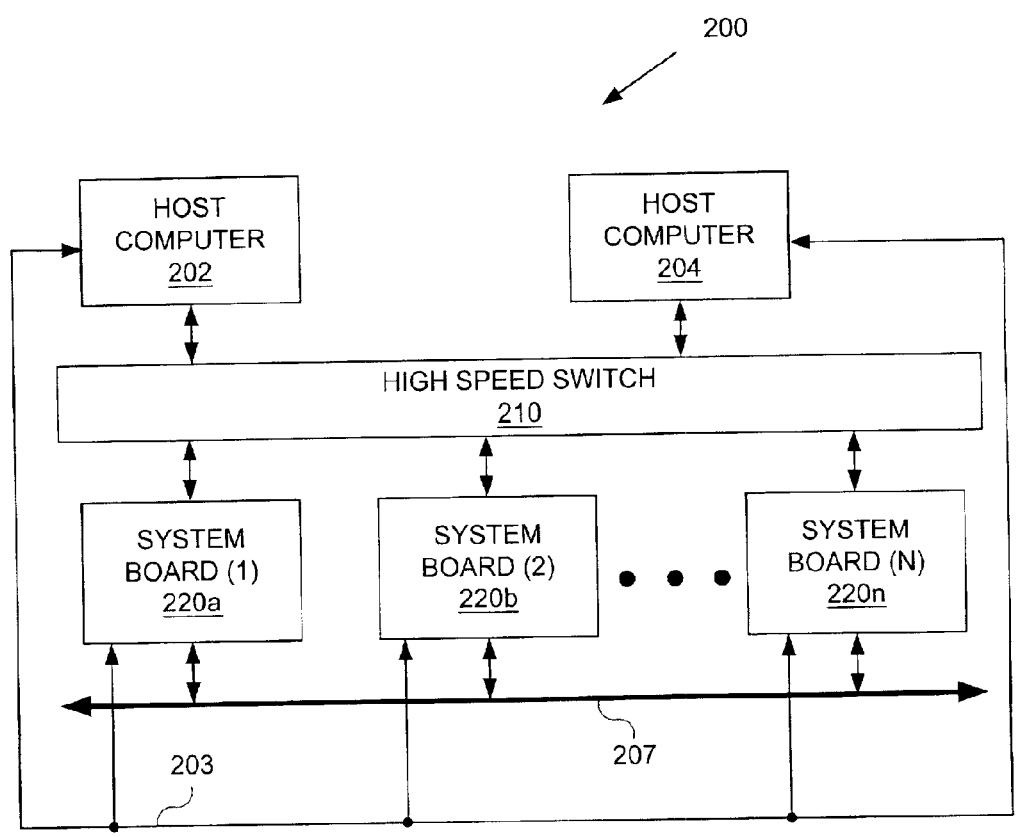
FIG. 2 shows a parallel computer system in accordance with an embodiment of the present invention.

FIG. 2 shows exemplary elements of a system (200), in accordance with one or more embodiments of the present invention. Cycle-based computation, such as a logic simulation on the system (200), involves one or more host computers (202, 204) managing the logic simulation(s) executing on one or more system boards (220a, 220b, 220n). Each system board contains one or more Application Specific Integrated Circuits (ASIC). Each ASIC contains multiple execution processors. The host computers (202, 204) may communicate with the system boards (220a, 220b, 220n) using one of several pathways. The host computers (202, 204) include interface hardware and software as needed to manage a logic simulation. A high speed switch (210) connects the host computers (202, 204) to the system boards (220a, 220b, 220n). The high speed switch (210) is used for loading and retrieval of state information from the execution processors located on ASICs on each of the system boards (220a, 220b, 220n). The connection between the host computers (202, 204) and system boards (220a, 220b, 220n) also includes an Ethernet connection (203). The Ethernet connection (203) is used for service functions, such as loading a program and debugging. The system also includes a backplane (207). The backplane (207) allows the ASICs on one system board to communicate with the ASICs of another system (220a, 220b, 220n) without having to communicate with an embedded controller located on each system board. Additional system boards may be added to the system by connecting more system boards to the backplane (207).

Figure 3:
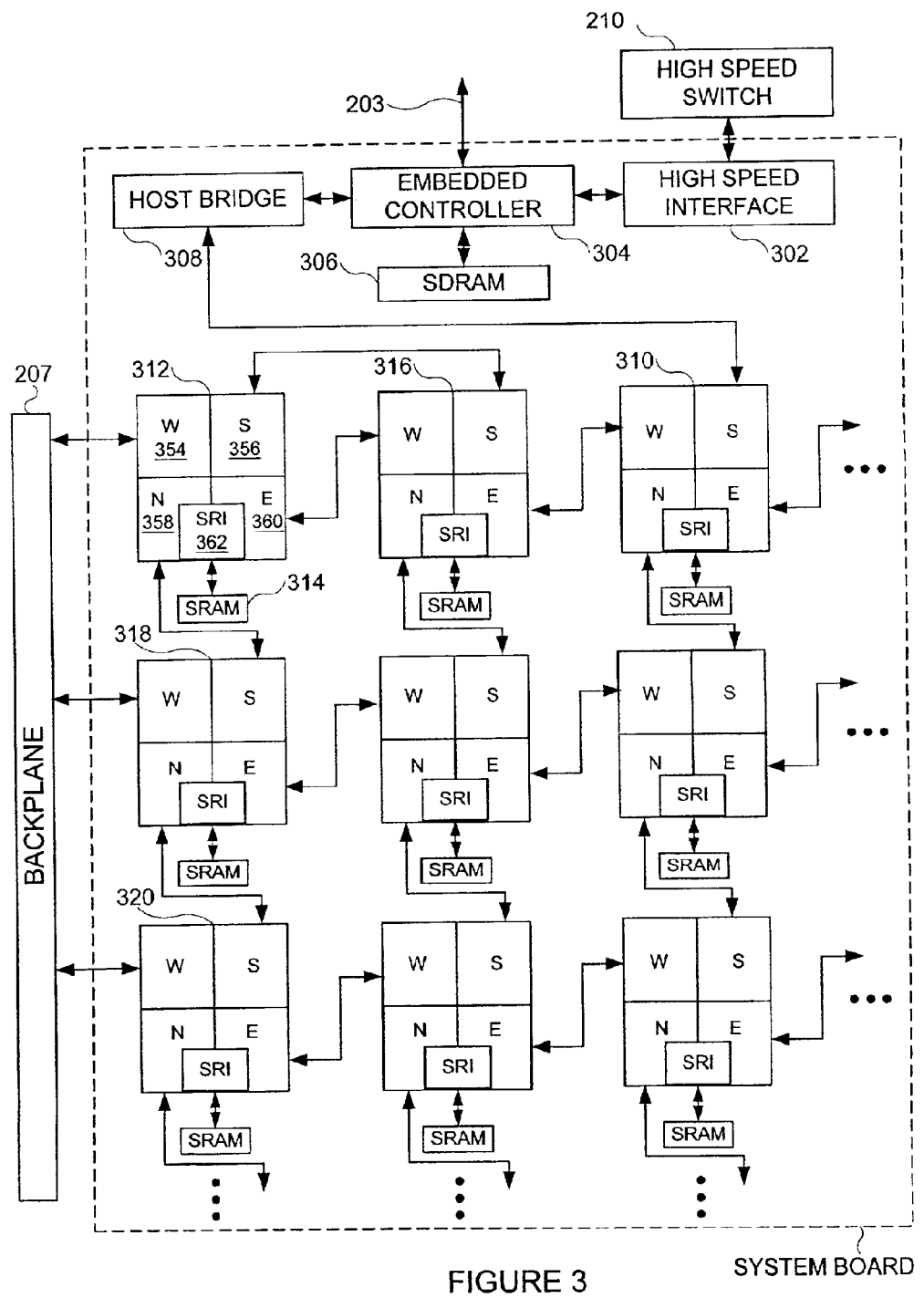
FIG. 3 shows a system board block diagram in accordance with an embodiment of the present invention.

FIG. 3 shows a block diagram of a system board in accordance with one or more embodiments of the present invention. The system board is representative of any of the system boards (e.g., system board (220a, 220b, 220n)) shown in FIG. 2. The system board may include multiple ASICs. Each ASIC is connected via a two-dimensional mesh. Each ASIC has four input/output buffers referenced as North (N), South (S), East (E), and West (W). For example, an ASIC (312) has four input/output buffers N (358), S (356), E (360), and W (354). Each ASIC connects to other ASICs using the four input/output buffers, one for each neighboring ASIC. An edge ASIC may connect to other edge ASIC to create a secondary connection. For example, ASIC (312) and ASIC (316) connect using the E and W input/output buffers, respectively, and using their respective S input/output buffers. Another possible connection for edge ASICs is a connection to the backplane (207), which connects to other system boards. For example, ASICs (312, 318, 320) connect to the backplane, each using their respective W input/output buffers. Each ASIC may also connect to external memory in the form of static random access memory (SRAM) through a SRAM interface (SRI). For example, ASIC (312) connects to SRAM (314) through SRI (362).

One ASIC on each system board is used as an operative connection to an embedded controller. For example, ASIC (310) uses its S input/output buffer to connect to an embedded controller (304) through a host bridge (308). The embedded controller (304) connects to an Ethernet network (203), associated memory in the form of a synchronous dynamic random access memory (SDRAM) (306), and a high speed switch interface (302). The high speed switch interface (302) connects to the high speed switch (210). The SDRAM (304) may store instructions for the embedded controller (304).

Figure 4:
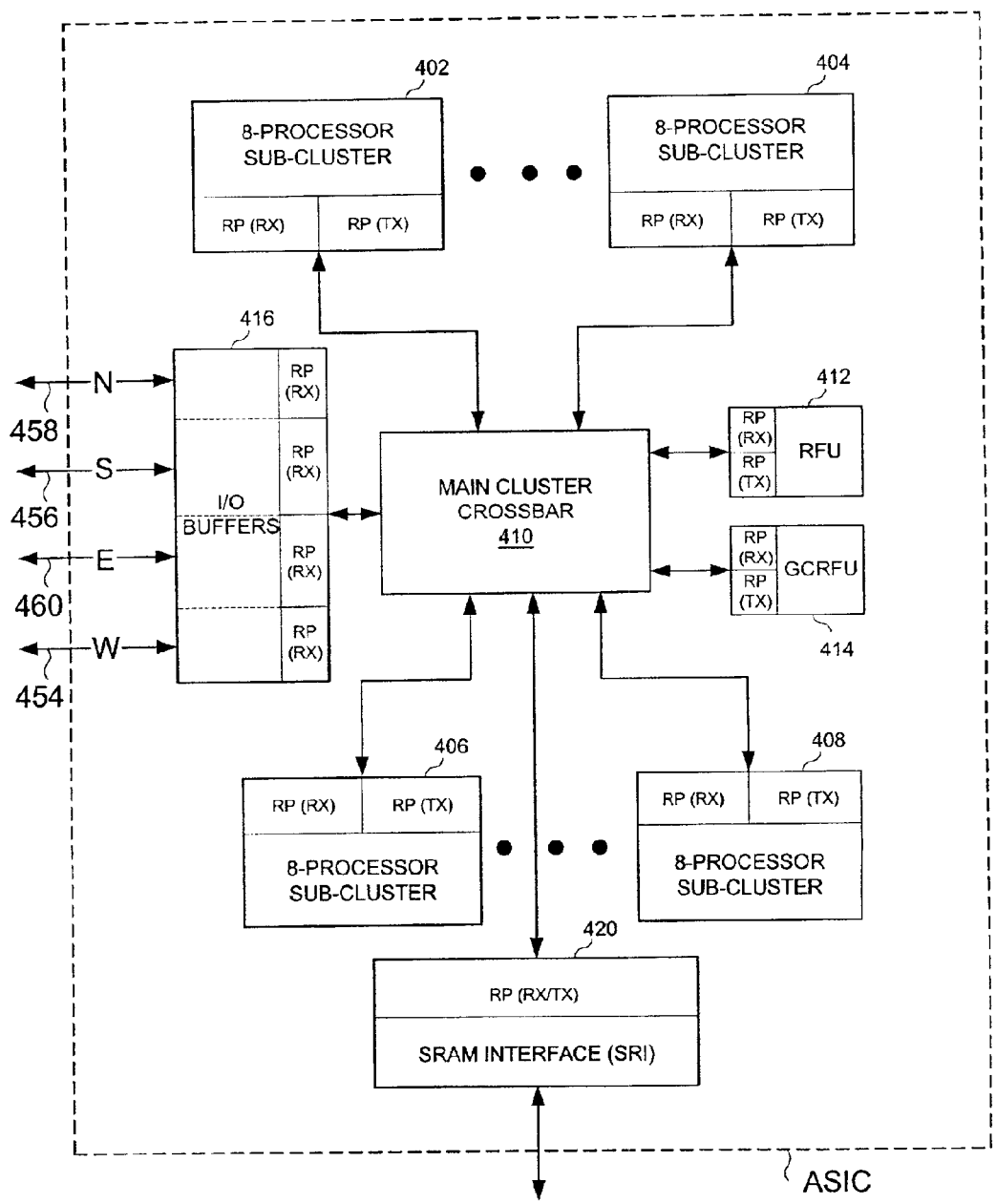
FIG. 4 shows an application specific integrated circuit (ASIC) block diagram in accordance with an embodiment of the present invention.

In accordance with one or more embodiments of the present invention, a block diagram of an ASIC is shown in FIG. 4. The ASIC is representative of any of the ASICs (e.g., ASIC (310, 312, 316, 318, 320)) shown in FIG. 3. A main cluster crossbar (410) connects to multiple terminal points. Each terminal point has at least one statically scheduled routing processor connected to at least one functional element. The main cluster crossbar (410) enables message passing and communication of information on the ASIC. For example, the main cluster crossbar (410) connects to a statically scheduled routing processor (not shown) that is associated with one of the input/output buffers (416), such as input/output buffer N (458). Other terminal points include, but are not limited to, additional input/output buffers (456, 460, 454), 8-processor sub-clusters (402, 404, 406, 408) that includes 8 processors connected by a sub-cluster crossbar, a SRI (420), a register file unit (RFU) (412), and a global control register file unit (GCRFU) (414).

In one or more embodiments of the present invention, each input/output buffer is associated with a statically scheduled routing processor that is arranged to receive information from another input/output buffer on a different ASIC. Alternate connections may include one of the input/output buffers communicating with the embedded controller (304) through the host bridge (308) or one of the input/output buffers connected to the backplane (207), as described previously. The RFU (412) is associated with two statically scheduled routing processors to send and receive information for temporarily parking messages routed on the main cluster crossbar. The GCRFU (414) is also associated with two statically scheduled routing processors to simultaneously send and receive information for temporarily parking messages routed on the main cluster crossbar and global control information, such as a broadcast tree arbiter to store messages and control functions. The SRI (420) is associated with a single statically scheduled routing processor that both sends and receives information; however the send or receive operation is not arrange to occur simultaneously. The SRI (420) provides an interface to external memory and may be accessed by the execution processors in the sub-clusters (402, 404, 406, 408) through the main cluster crossbar (410). Each 8-processor sub-cluster (402, 404, 406, 408) is associated with two statically scheduled routing processors, one to receive and one to send information simultaneously. Each statically scheduled routing processor is associated with a routing table to determine when and where the routing processor should send or receive information. Because the routing is determined a priori, a destination or origination address is not required in the transferred information. However, a tag identification is transferred with the information. The tag identification provides an arrangement to check that the received information occurred during the proper cycle. Each statically scheduled routing processor checks the tag identification to maintain proper operation of the system. Also, to ensure that no bit errors occurred during transmission, each statically scheduled routing processor may have an error correction mechanism to fix a limited number of bit errors.

Figure 5:
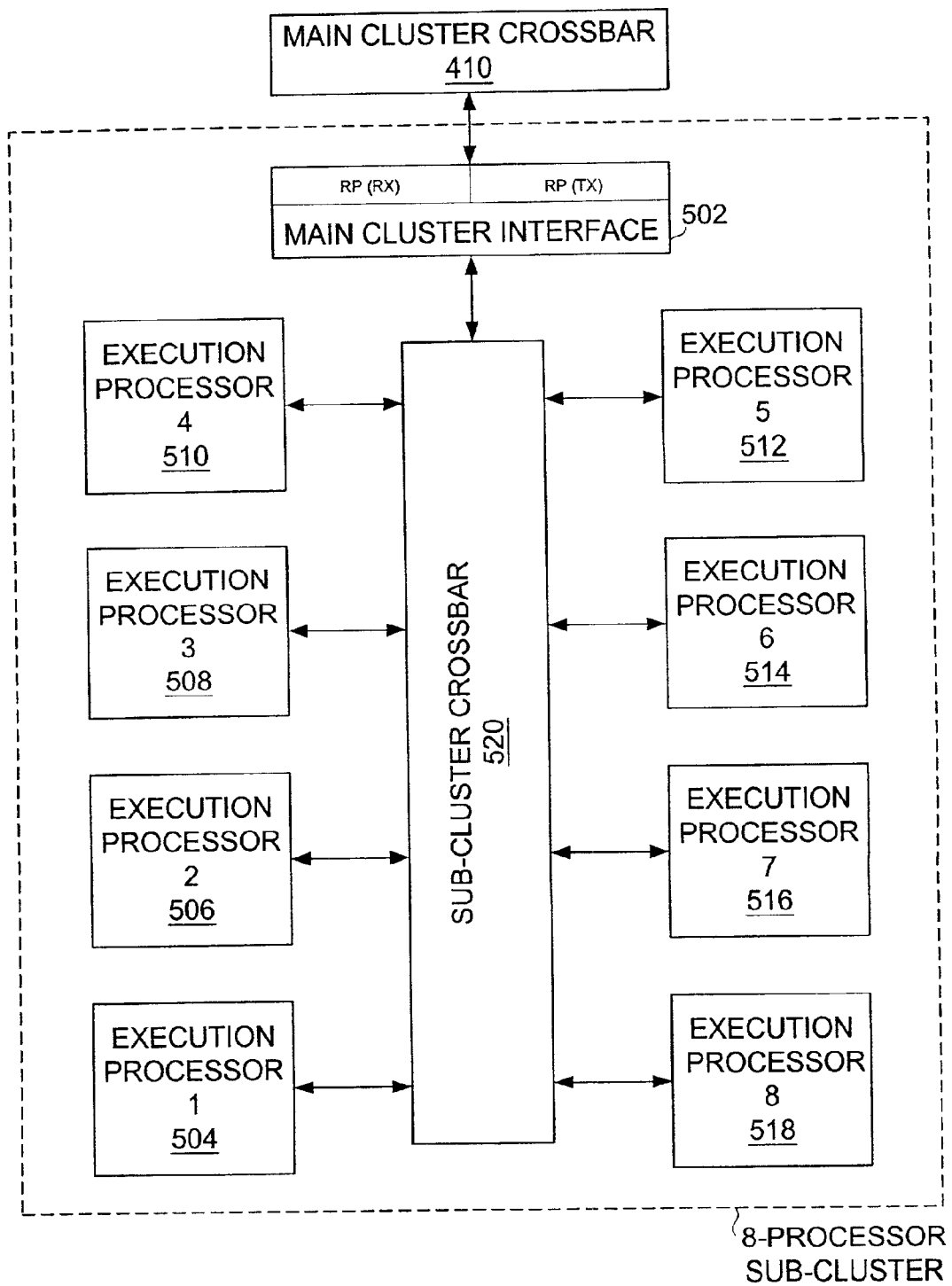
FIG. 5 shows a sub-cluster processor block diagram in accordance with an embodiment of the present invention.

In accordance with one or more embodiments of the present invention, an 8-processor sub-cluster is shown in FIG. 5. The 8-processor sub-cluster is representative of any of the 8-processor sub-cluster (e.g., 8-processor sub-cluster (402, 404, 406, 408)) shown in FIG. 4. The 8-processor sub-cluster has a sub-cluster crossbar (520) that connects to eight execution processors (504, 506, 508, 510, 512, 514, 516, 518) that perform cycle-based computation. The execution processors are capable of executing custom instructions that enable cycle-based computations, such as specific logic operations (e.g., four input, one output Boolean functions), and control instructions, such as a "synchronization" instruction that stalls an execution processor until all execution processors are ready to resume. The sub-cluster crossbar (520) is associated with a main cluster interface (502) that contains two statically scheduled routing processors to send and receive information simultaneously. The main cluster interface (502) transfers information over the main cluster crossbar (410).

Simulation of the cycle-based logic design in a cycle-based system occurs on a processor array in two modes: a run mode segment and a control mode segment. Run mode segment is the basic simulation running mode. In the run mode segment, there is no communication necessary between the host and simulation system besides basic runtime control and the execution of any user-provided C coded routines. In the control mode segment, the host sends commands to the simulation hardware and waits for responses. The control mode segment is typically used in debugging and initialization of the simulation system, initialization of the processor array, downloading execution processor code onto the processor array, state tracing of a simulation running on the processor array, loading stimulus data from the host computer onto the processor array, transmitting error information, polling for interrupts from the host computer, and loading and unloading test vector and/or simulation results. Cycle-based logic design may also be simulated on a processor array, or a portion of the processor array. Thus, references herein to the processor array may refer to a portion of the processor array, or to multiple processor arrays.

Figure 6:
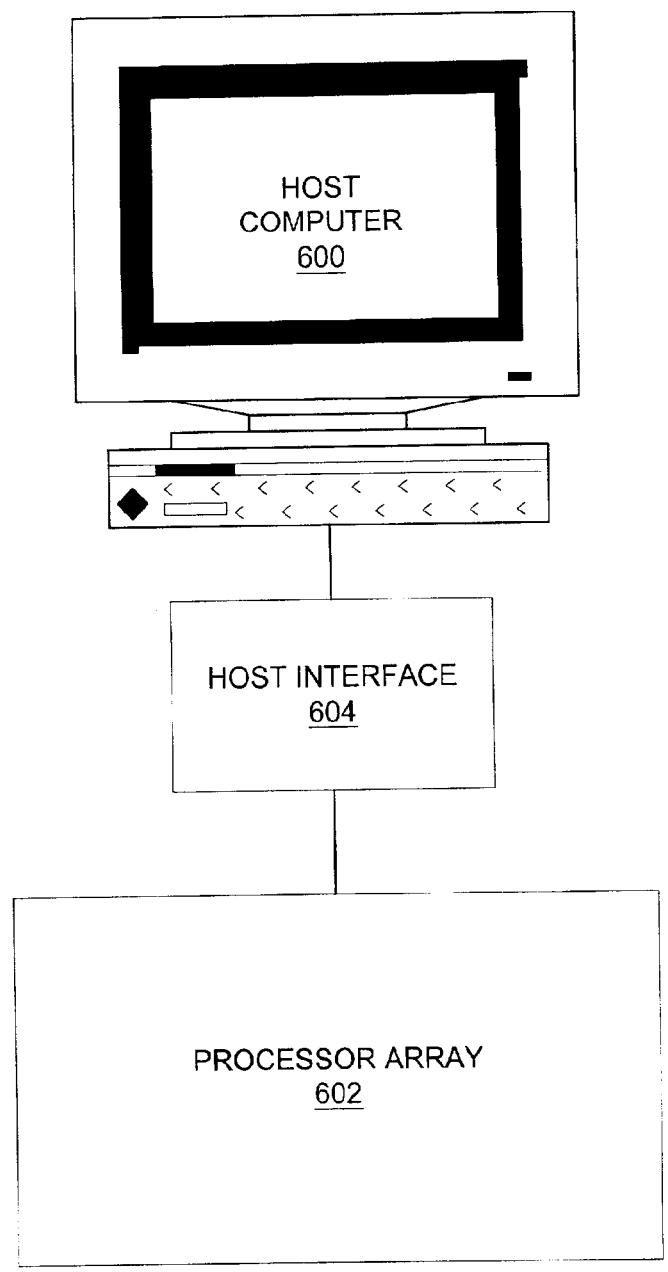
FIG. 6 shows a cycle-based system in accordance with an embodiment of the present invention.

FIG. 6 shows a host computer (600), a processor array (602), and a host interface (604). The host interface (604) is connected to the processor array (602) and the host computer (600). In one or more embodiments of the present invention, the host interface includes a bus a high speed network, and a high speed switch. The host interface (604) may exist on the host computer (600), on the chassis of the processor array (602), on both the host computer (600) and on the chassis of the processor array (602), or may exist on a chassis separate from the host computer (600) or the chassis of the processor array (602). There may exist multiple host interfaces (604), multiple host computers (600), and multiple processor arrays (602).

In control mode segment, the host computer controls and communicates with the processor array using an access component. The access component includes a broadcast tree and a reply tree and provides the host computer access to the internal state of the processor array. ASICs are nodes of the broadcast tree and the reply tree, connected together using the data connection component.

Propagation of commands sent as messages on the broadcast tree is implemented through the use of a broadcast parent port on each ASIC, and zero or more broadcast child ports on each ASIC. An input output buffer (IOB) on each ASIC is configured as the broadcast parent port. Zero or more (up to three) IOBs on each ASIC are configured as broadcast child ports. A configuration status of an IOB is represented by IOB state bits associated with each IOB. In order to configure an IOB, one or more appropriate IOB state bits are set to an appropriate value.

In control mode segment, commands are issued from the host interface and sent to a particular ASIC (the "broadcast tree root"). The broadcast tree root has an IOB configured as a broadcast parent port, which is connected to the host interface. A command issued from the host interface is propagated to any IOBs of the broadcast tree root that are configured as broadcast child ports. The broadcast tree is configured so that the command may propagate to each ASIC in the broadcast tree from the broadcast tree root. The command propagates among ASICs using IOBs of the ASICs. The command leaves a first ASIC using an IOB of the first ASIC configured as a broadcast child port, and enter a second ASIC using an IOB of the second ASIC configured as a broadcast parent port.

Figure 7:
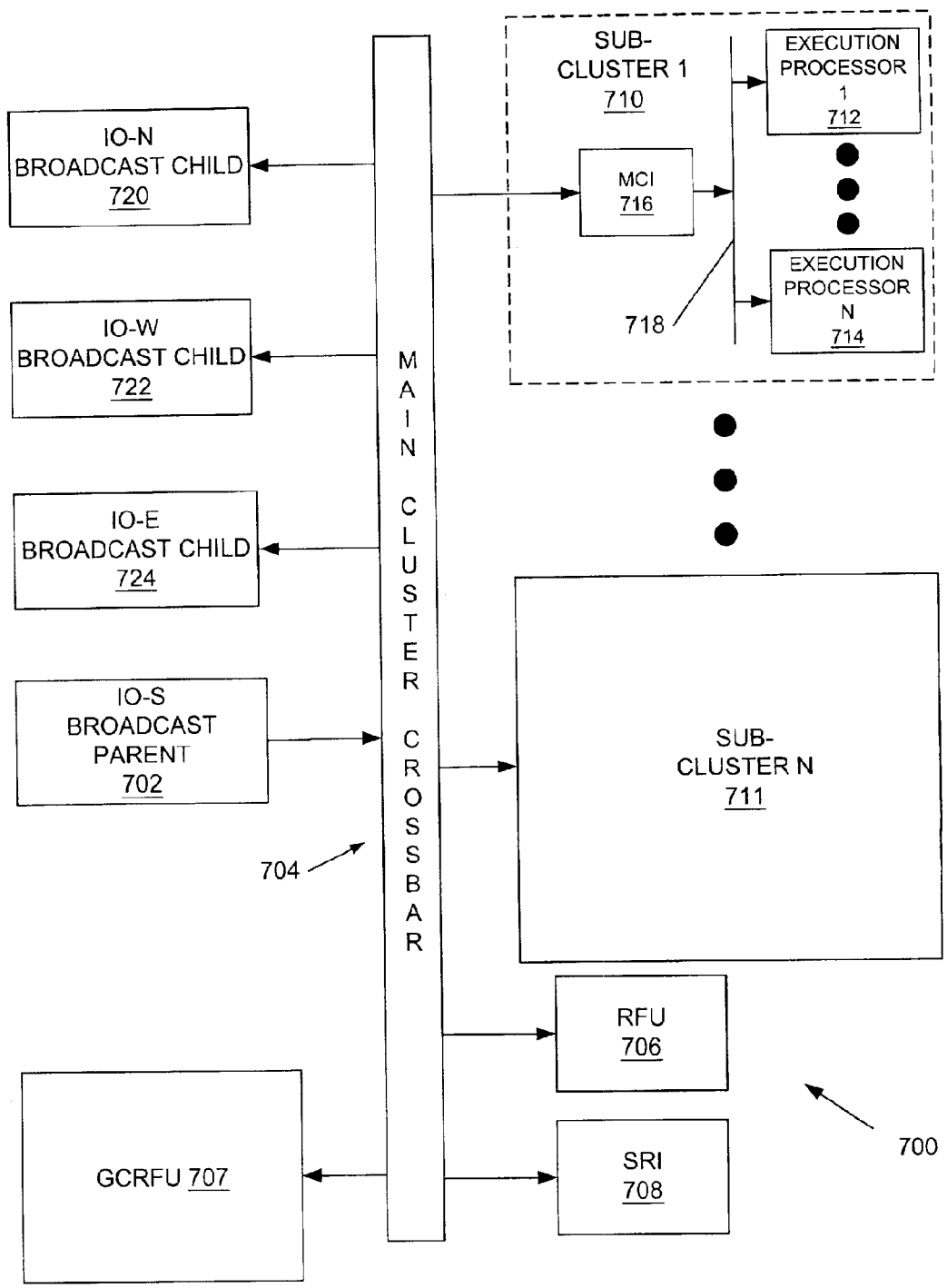
FIG. 7 shows an arrangement of functional units on an ASIC of a broadcast tree in accordance with an embodiment of the present invention.

FIG. 7 shows how functional units on an ASIC of a broadcast tree are arranged with respect to the propagation of commands. The IOB S (702) is configured as a broadcast parent port, into which incoming commands are received and distributed over a main cluster crossbar (704) to functional units of the ASIC (700), including an RFU (706), a GCRFU (707), an SRI (708), sub-cluster 1 (710) through sub-cluster N (711). Execution processor 1 (712) through execution processor N (714) receives commands using a Main Cluster Interface (716) and a sub-cluster crossbar (718). If so configured, commands may be propagated to other ASICs through IOBs N (720), W (722), and E (724), which are configured as broadcast child ports.

Figure 8:
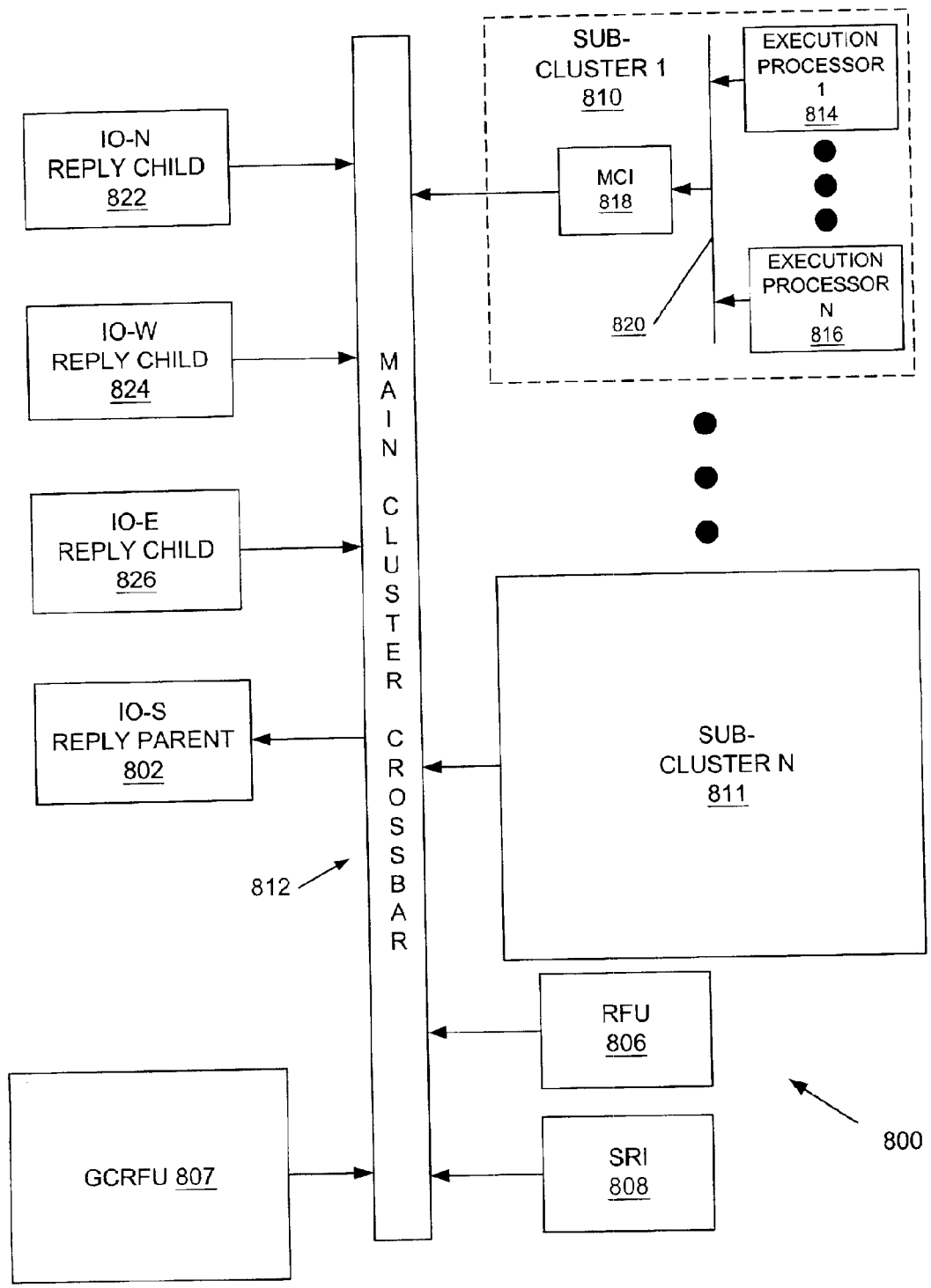
FIG. 8 shows an arrangement of functional units on an ASIC of a reply tree in accordance with an embodiment of the present invention.

FIG. 8 shows how functional units on an ASIC of a reply tree are arranged with respect to how information is transmitted from the ASIC farther up the reply tree (towards the reply tree root). An IOB S (802), is configured as a reply parent port to transmit information, e.g., responses, up the reply tree. Responses from functional units of the ASIC (800), including an RFU (806), a GCRFU (807), an SRI (808), sub-cluster 1 (810) through sub-cluster N (811) are sent over a main cluster crossbar (812). Execution processor 1 (814) through execution processor N (816) sends responses over the MCI (818) and a sub-cluster crossbar (820). If so configured, incoming responses may be received from IOBs N (822), W (824), and E (826), which are configured as reply child ports.

Commands may be propagated to each ASIC, or may be propagated to a particular ASIC. In normal control mode segment operation, each ASIC in a simulation has a unique identifier, i.e., an ASIC identifier, which is unique within the simulation. The unique identifier, in one or more embodiments of the present invention, is a 12 bit field stored in a register on the ASIC. Each command has an ASIC identification tag, and any ASIC with a unique identifier matching the ASIC identification tag of a particular command may respond to the command. For example, the host interface may send a command to a particular ASIC, requesting the value of certain state data associated with the ASIC. A response by the ASIC to the command may include transmitting information, such as the state data, to the host interface using the reply tree. In order to respond to the command, each ASIC has one IOB configured as a reply parent port and zero or more (up to three) IOBs configured as reply child ports. One ASIC (a "reply tree root") of the reply tree is connected to the host interface using an IOB configured as a reply parent port.

Each portion of state data associated with each ASIC is accessible to a host interface through commands. State data on an ASIC is associated with a 64 bit field. In order to access state data on an ASIC, a first command is sent, which has a 32 bit address associated with the ASIC. A second command has a 32 bit address associated with the address where the state data is located on the ASIC.

When an ASIC, e.g., a first ASIC, responds to a command, the first ASIC transmits requested information, in the form of a response, on a reply parent port. If the first ASIC is not connected directly to the host interface (i.e., not the reply tree root), the first ASIC transmits the response to a second ASIC using an input output port of the second ASIC configured as a reply child port. A response received by an ASIC, e.g., the second ASIC, from an IOB of the second ASIC configured as a reply child port is retransmitted on an IOB of the second ASIC configured as a reply parent port.

If ASICs that form a broadcast tree are properly configured as a broadcast tree, the host interface can propagate commands to each ASIC of the broadcast tree. If ASICs that form a reply tree are properly configured as a reply tree, the host interface can receive information from each ASIC of the reply tree.

Commands propagated along a broadcast tree and responses transmitted along a reply tree are associated with latencies. A latency is an amount of time required for information (i.e., commands and responses) to travel from a source to a destination on a broadcast tree or a reply tree. Thus, when a command is sent on a broadcast tree to one or more ASICs, the ASICs receive the command at a certain time, dependent upon latencies associated with paths traveled by the command in order to reach the destination. Thus, a command may reach different ASICs at different times. Likewise, a response transmitted from an ASIC to the host interface is associated with latencies. A first response sent from a first ASIC at the same time a second response is sent from a second ASIC may reach the host interface at a different time than the response sent from the second ASIC (due to differing latencies associated with differing paths traveled by first and second responses).

A priority encoding scheme is used to select a response incoming to an IOB configured as a reply parent or reply child when two or more responses arrive simultaneously. For example, the host interface may propagate a command to each ASIC (a poll) requesting that each ASIC with a particular status condition respond. If two responses to the poll arrive simultaneously at a reply parent port or a reply child port, one of the responses may be selected arbitrarily and retransmitted. Thus, collisions between simultaneous responses can be resolved.

Commands to ASICs and responses from ASICs may be interleaved. For example, the host interface may send a command to ASIC X at time A, and send a command to ASIC Y at time A+3. A response may be due back from ASIC X at time A+6, due to latencies of a path traveled from the host interface to ASIC X, and from ASIC X to the host interface. Latencies of path traveled are obtained from a latency data store accessible to the host interface. Because of known latencies associated with each path traveled to each ASIC from the host interface, and from each ASIC to the host interface, commands and responses may be interleaved.

Figure 9:
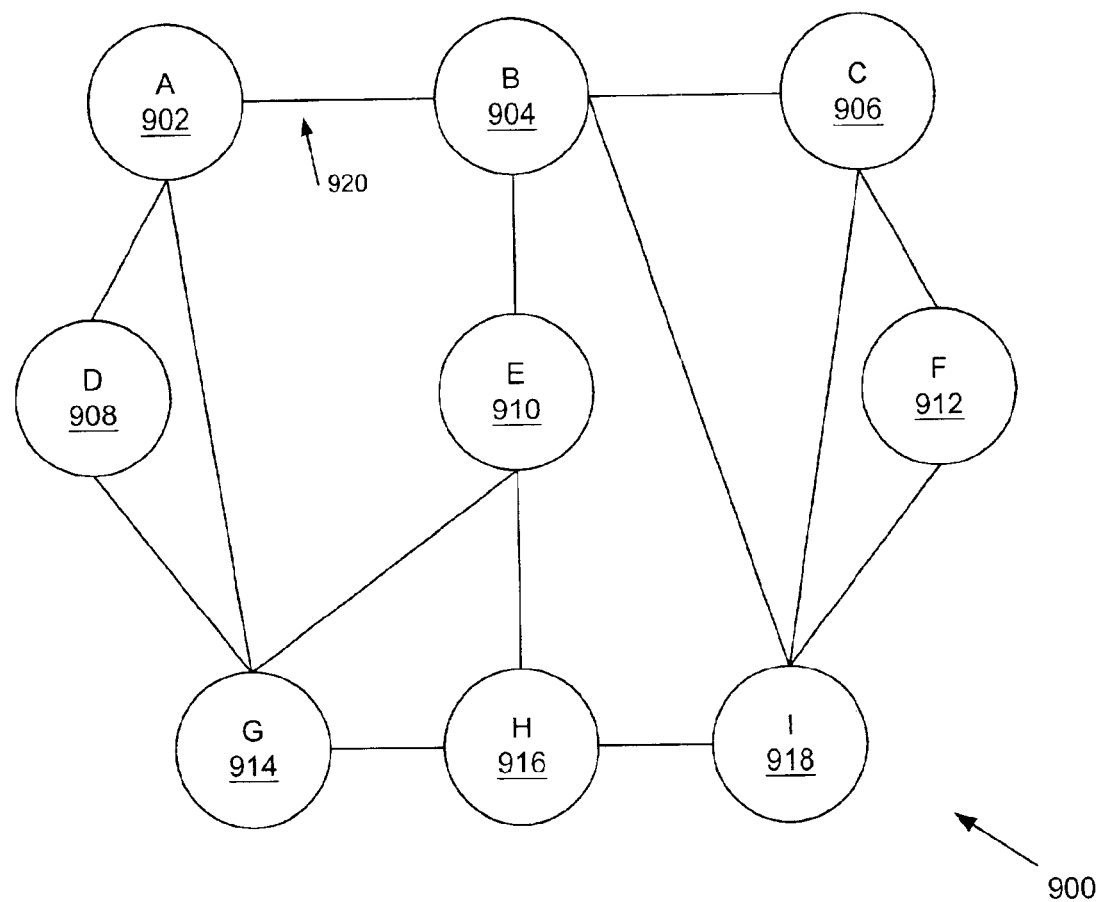
FIG. 9 shows a graph of ASICs in a simulation in accordance with an embodiment of the present invention.

Connections between ASICs of a simulation form a graph, with ASICs as vertices of the graph. The edges of the graph are represented by connections between the ASICs using IOBs. FIG. 9 shows a graph (900) on a vertex set {A, B, C, D, E, F, G, H, I}, with vertices A (902), B (904), C (906), D (908), E (910), F (912), G (914), H (916), and I (918). Each vertex, shown in FIG. 9, represents an ASIC in a processor array. An edge, e.g., edge A-B (920) connects vertex A (902) to vertex B (904) and represents a portion of the data connection component connecting the ASICs represented by vertex A (902) to vertex B (904). An IOB for vertex A and an IOB for vertex B are used to connect vertex A (902) to vertex B (904).

Figure 10:
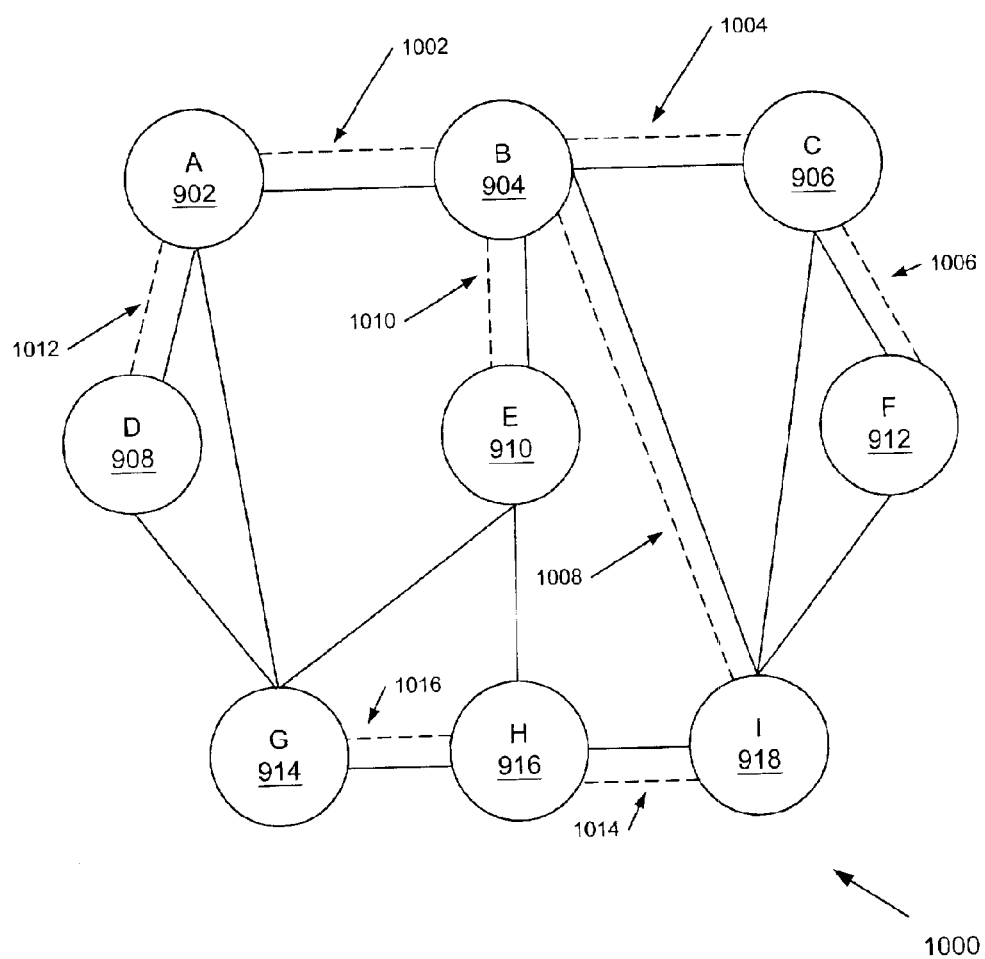
FIG. 10 shows a spanning tree constructed from a graph in accordance with an embodiment of the present invention.

In order to configure a broadcast tree, a minimal spanning tree is created from the graph. FIG. 10 shows a spanning tree (1000) constructed from the graph (900) shown in FIG. 9. The spanning tree (1000) is a set of paths through the graph (900) that visits every vertex (and therefore, every ASIC) exactly once. Edges in the spanning tree (1000), which are represented by dotted lines, include edges A-B (1002), B-C (1004), C-F (1006), B-I (1008), B-E (1010), A-D (1012), I-H (1014), and H-G (1016). Because every ASIC is visited once, the spanning tree ensures that any command sent to a broadcast tree can reach each ASIC. Several well-known algorithms (e.g., Prim's algorithm) exist for creating a minimal spanning tree, which produces a spanning tree with minimal depth (i.e., traversal from a root node to a leaf node encounters minimal edges). A broadcast tree that is a minimal spanning tree thus enables minimal command transmission latency. Likewise, a reply tree that is a minimal spanning tree is created in a similar manner, thus ensuring that any ASIC is able to send a response to the host computer and enabling minimal response transmission latency.

Figure 11:
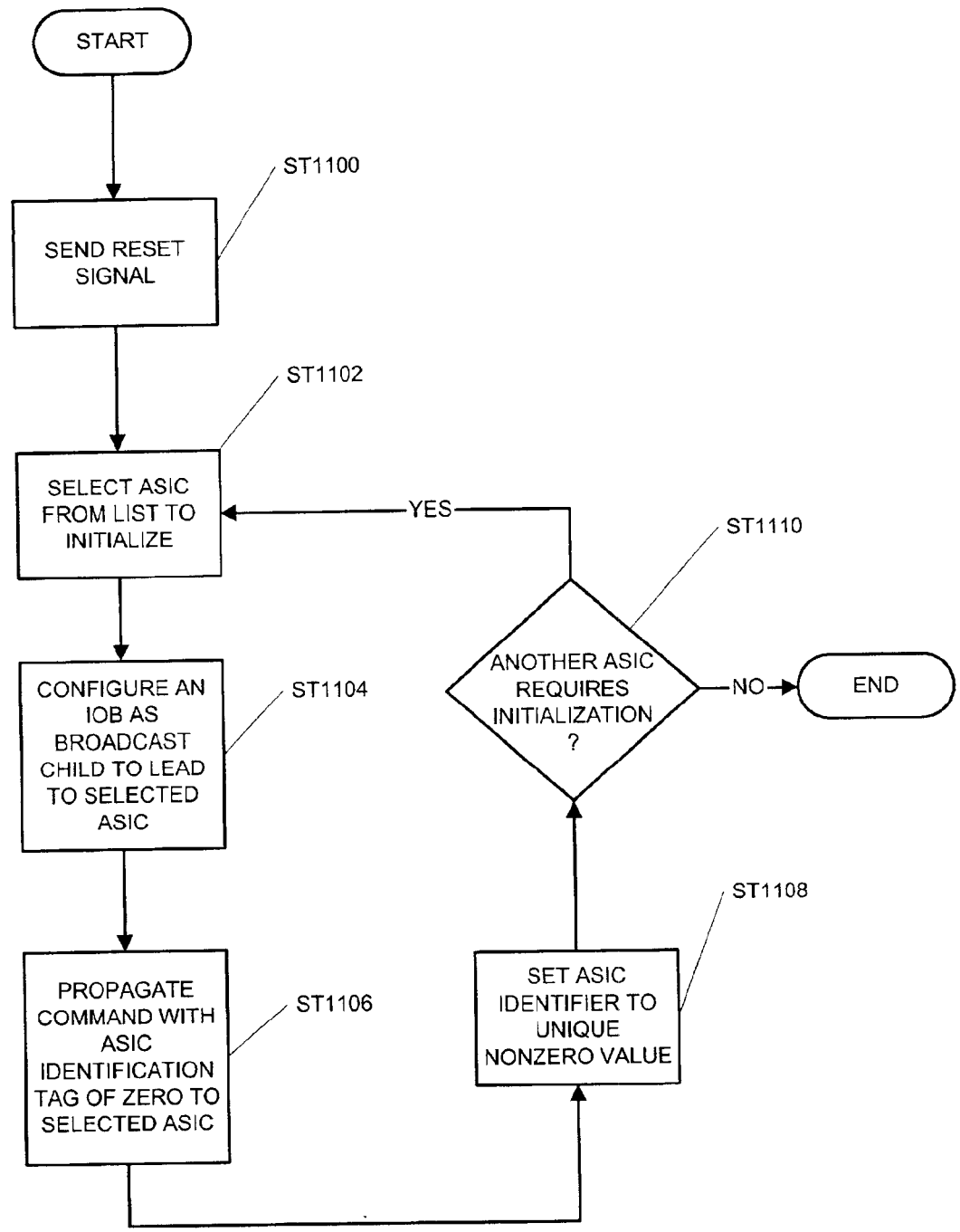
FIG. 11 shows an implementation of a broadcast tree and a reply tree that links ASICs on a processor array in accordance with an embodiment of the present invention.

In order to configure a broadcast and a reply tree, an initialization sequence is performed on a minimal spanning tree of a graph of ASICs. FIG. 11 shows an initialization sequence to configure a broadcast tree from a minimal spanning tree of a graph of ASICs. A first step of the initialization sequence is sending a reset signal to all ASICs of the minimal spanning tree (Step 1100). Upon receiving the reset signal, each ASIC is set to a default configuration state wherein each ASIC's unique identifier is set to zero, and the IOBs of each ASIC are set to a non-configured state, wherein each ASIC accepts any input on the data communication component (i.e., each ASIC accepts commands on each IOB).

Furthermore, each ASIC, upon accepting any input or command, does not propagate or retransmit the input or command onto any other ASIC. Because each ASIC does not propagate or re-transmit an input or command onto any other ASIC, only an ASIC directly connected to a host interface (a root ASIC), or an ASIC connected to an ASIC via a configured IOB is capable of receiving any input or command when the initialization sequence begins.

Continuing with the initialization sequence, an ASIC from the minimal spanning tree is selected to initialize (Step 1102). The selected ASIC is chosen from a predetermined list of ASICs to initialize. The root ASIC is initialized first. An IOB is configured as a broadcast child to lead to the selected ASIC (Step 1104). If the selected ASIC is the root ASIC, then no IOB is configured. The IOB that is configured is not on the selected ASIC, but is on another ASIC that has an IOB capable of connecting to the selected ASIC. An initialization command, a type of command used in the initialization sequence, with ASIC identification tag equal to zero, is propagated to the selected ASIC (Step 1106). Although each un-initialized ASIC has a unique identifier of zero, only one ASIC (the selected ASIC) takes action upon receiving the initialization command because IOBs of un-initialized ASIC are listening on every IOB and are not propagating commands onto other ASICs. Thus, the selected ASIC is the only un-initialized ASIC to receive the initialization command. The unique identifier of the selected ASIC is set to a unique, nonzero value (Step 1108). The unique, nonzero value is carried as part of the initialization command. A determination is made as to whether another ASIC requires initialization (Step 1110). If another ASIC requires initialization, Step 1102 is performed. Otherwise, the initialization sequence ends.

When creating the broadcast tree from the minimal spanning tree, ASICs are added to the broadcast tree one ASIC at a time, and commands to initialize ASICs are sent along the data connection component, as are commands sent on a fully configured, functional broadcast tree. Furthermore, other steps may be added to the initialization sequence as necessary. For example, Step 1108 may include configuring additional IOBs as reply child ports, reply parent ports, broadcast parent port, and reply parent port. Thus, the reply tree may be configured after the broadcast tree. Alternatively, configuration of the reply tree may be interleaved with configuration of the broadcast tree by configuring the reply tree for a portion of a graph immediately after configuring the broadcast tree for the portion of the graph.

Figure 12:
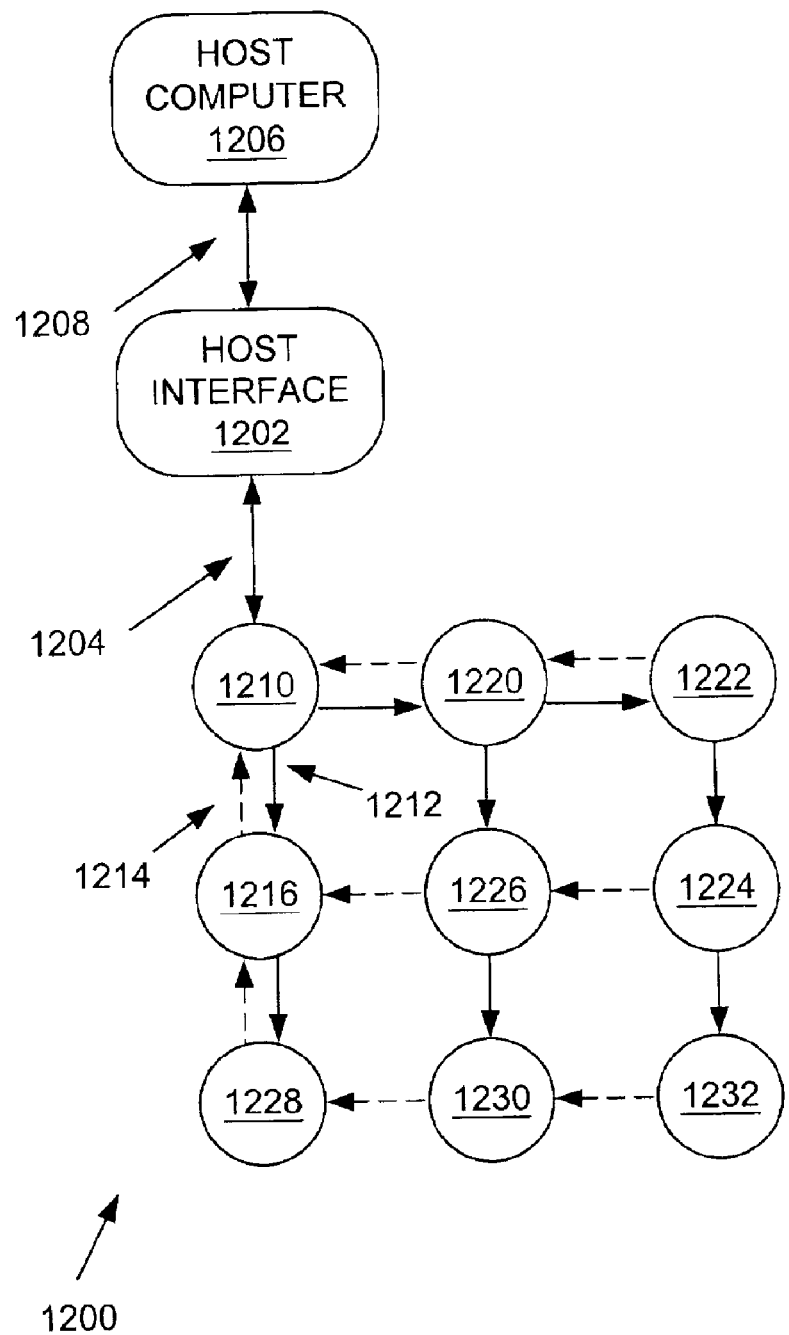
FIG. 12 shows a flowchart representing an initialization sequence for a broadcast reply tree in accordance with an embodiment of the present invention.

FIG. 12 shows an implementation of a broadcast tree and a reply tree produced as a result of the initialization sequence shown in FIG. 11 (for purposes of explanation, a combination of a broadcast tree and a reply tree is referred to as a "broadcast reply tree"). A broadcast reply tree (1200) is linked to a host interface (1202) using a data connection component (1204). A host computer (1206) is linked to the host interface (1202) using a host computer interface channel (1208). Dashed lines represent reply tree connections, and solid lines represent broadcast tree connections. For example, a first ASIC (1210) has a broadcast tree connection (1212) and a reply tree connection (1214) to a second ASIC (1216). Additional ASICs (1220, 1222, 1224, 1226, 1228, 1230, and 1232) are also able to receive commands and respond to commands (i.e., send a response).

Advantages of the present invention include one or more of the following. The invention provides functionality for controlling a processor array used in cycle-based computation, where messages used to control the processor array are not required to use auxiliary signal paths (i.e., signal paths different from those used to send messages during cycle-based computation). As a result, execution processor pin count is reduced. The invention uses a minimal spanning tree to send commands to and receive responses from the processor array, thus reducing communication latency. The invention avoids the use of a bus arrangement to control the ASICs. One skilled in the art will appreciate that the present invention may have additional advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for controlling a processor array by a host computer, comprising:
   creating a graph of a plurality of nodes using a data connection component;
   configuring a broadcast tree from a spanning tree of the graph;
   propagating a first command from the host computer to a member of the processor array using the broadcast tree;
   configuring a reply tree from a spanning tree of the graph;
   transmitting a response from the member of the processor array to the host computer using the reply tree; and
   configuring the data connection component to send at least one message selected from the first command and the response on at least one run mode communication path.

2. The method of claim 1, wherein the spanning tree comprises a minimal spanning tree.

3. The method of claim 1, wherein a time period required to propagate the first command from the host computer to the member of the processor array is predetermined.

4. The method of claim 1, wherein the time required to transmit the response from the member of the processor array to the host computer is predetermined.

5. The method of claim 1, wherein a member of the plurality of nodes comprises at least one member of the processor array.

6. The method of claim 1, wherein a member of the plurality of nodes is an application specific integrated circuit.

7. The method of claim 1, wherein the response is transmitted in response to the first command.

8. The method of claim 1, wherein configuring the broadcast tree comprises:
   generating a list of nodes to initialize from the spanning tree;
   selecting a selected node from the list of nodes;
   configuring a first input output buffer as a broadcast child port leading to the selected node;
   propagating an initialization command to the selected node over the data connection component; and
   setting a unique identifier of the selected node to a predetermined value specified by the initialization command.

9. The method of claim 8, further comprising:
   configuring a second input output buffer as a reply child port of the selected node.

10. The method of claim 9, further comprising:
    configuring the second input output buffer as a reply parent port of the selected node.

11. The method of claim 9, further comprising:
    configuring the second input output buffer as a broadcast parent port of the selected node.

12. The method of claim 8, wherein configuring the reply tree comprises:
    configuring a second input output buffer as a reply parent port of the selected node.

13. The method of claim 12, further comprising:
    configuring the second input output buffer as a reply child port of the selected node.

14. The method of claim 12, further comprising:
    configuring the second input output buffer as a broadcast parent port of the selected node.

15. The method of claim 1, further comprising:
    propagating a second command to a plurality of members of the processor array using the broadcast tree;
    transmitting a plurality of responses from the plurality of members of the processor array using the reply tree; and
    resolving a collision between members of the plurality of responses by selecting a member of the plurality of responses.

16. The method of claim 15, wherein the second command is propagated before the response is received by the host computer.

17. The method of claim 1, further comprising:
    configuring the broadcast tree to send the first command from the host computer to every node of the broadcast tree.

18. The method of claim 1, further comprising:
    configuring the broadcast tree to send the first command from the host computer to a particular node of the broadcast tree.

19. The method of claim 1, further comprising:
    configuring the reply tree to send the response to the host computer from every node of the reply tree.

20. A method for controlling a processor array by a host computer, comprising:
    creating a graph of a plurality of nodes using a data connection component;
    configuring a broadcast tree from a spanning tree of the graph;
    propagating a first command from the host computer to a member of the processor array using the broadcast tree;
    configuring a reply tree from a spanning tree of the graph;
    transmitting a response from the member of the processor array to the host computer using the reply tree;
    configuring the data connection component to send at least one message selected from the first command and the response on at least one run mode communication path;
    configuring the broadcast tree to send the first command from the host computer to every node of the broadcast tree;
    configuring the broadcast tree to send the first command from the host computer to a particular node of the broadcast tree; and configuring the reply tree to send the response to the host computer from every node of the reply tree.

21. A network system, comprising:

a plurality of nodes;

a plurality of communication paths between the plurality of nodes;

a broadcast tree comprised of the plurality of nodes interconnected by the plurality of communication paths;

a reply tree comprised of the plurality of nodes interconnected by the plurality of communication paths; and a data connection component configured to send a message using at least one of the broadcast tree and the reply tree on at least one run mode communication path, wherein a member of the plurality of nodes comprises at least one execution processor; and wherein the broadcast tree and the reply tree are operatively connected to a host computer.

22. The network system of claim 21, wherein the broadcast tree is configured to enable a communication sent from the host computer to a member of the plurality of nodes.

23. The network system of claim 21, wherein the reply tree is configured to enable a communication sent from a member of the plurality of nodes to the host computer.

24. The network system of claim 21, wherein a member of the plurality of nodes is an application specific integrated circuit.

25. A host computer system for controlling a processor array, comprising:

a processor;

a memory;

a storage device; and software instructions stored in the memory for enabling the host computer system under the control of the processor, to perform:

creating a graph of a plurality of nodes using a data connection component;

configuring a broadcast tree from a spanning tree of the graph;

propagating a first command from the host computer to a member of the processor array using the broadcast tree;

configuring a reply tree from a spanning tree of the graph;

transmitting a response from the member of the processor array to the host computer using the reply tree; and configuring the data connection component to send at least one message selected from the first command and the response on at least one run mode communication path.

26. An apparatus for controlling a processor array by a host computer, comprising:

means for creating a graph of a plurality of nodes using a data connection component;

means for configuring a broadcast tree from a spanning tree of the graph;

means for propagating a first command from the host computer to a member of the processor array using the broadcast tree;

means for configuring a reply tree from a spanning tree of the graph;

means for transmitting a response from the member of the processor array to the host computer using the reply tree; and means for configuring the data connection component to send at least one message selected from the first command and the response on at least one run mode communication path.

* * * * *